(12) United States Patent
Stern et al.

(10) Patent No.: US 7,247,582 B2
(45) Date of Patent: Jul. 24, 2007

(54) DEPOSITION OF TENSILE AND COMPRESSIVE STRESSED MATERIALS

(75) Inventors: Lewis Stern, Williston, VT (US); John Albright, Fishkill, NY (US)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 11/134,981

(22) Filed: May 23, 2005

(65) Prior Publication Data

US 2006/0264063 A1    Nov. 23, 2006

(51) Int. Cl.
*H01L 21/31*    (2006.01)
(52) U.S. Cl. .................. 438/776; 438/706; 438/791; 438/792; 438/763; 438/703; 438/776; 257/E21.269; 257/E21.293
(58) Field of Classification Search ................ None
See application file for complete search history.

(56) References Cited

U.S. PATENT DOCUMENTS

| | | |
|---|---|---|
| 3,798,061 A | 3/1974 | Yamazaki |
| 4,089,992 A | 5/1978 | Doo et al. |
| 4,118,539 A | 10/1978 | Hirai et al. |
| 4,279,947 A | 7/1981 | Goldman et al. |
| 4,395,438 A | 7/1983 | Chiang |
| 4,435,898 A | 3/1984 | Gaur et al. |
| 4,549,064 A | 10/1985 | Delfino |
| 4,717,602 A | 1/1988 | Yamazaki |
| 4,877,651 A | 10/1989 | Dory |
| 4,894,352 A | 1/1990 | Lane et al. |
| 4,948,482 A | 8/1990 | Kobayashi et al. |
| 5,040,046 A | 8/1991 | Chhabra et al. |
| 5,306,946 A | 4/1994 | Yamamoto |
| 5,399,387 A | 3/1995 | Law et al. |
| 5,877,095 A | 3/1999 | Tamura et al. |
| 5,942,804 A | 8/1999 | Mohwinkel et al. |
| 5,985,771 A | 11/1999 | Moore et al. |

(Continued)

FOREIGN PATENT DOCUMENTS

EP    0303508    2/1989

OTHER PUBLICATIONS

Johnson et al; "Characterization of LPCVD of Silicon.." Mat. Res. Soc. Symp. Proc. vol. 146. 1989 Materials Research Society.

(Continued)

*Primary Examiner*—Michael Lebentritt
*Assistant Examiner*—Kyoung Lee
(74) *Attorney, Agent, or Firm*—Janah & Associates

(57) ABSTRACT

A method of depositing tensile or compressively stressed silicon nitride on a substrate is described. Silicon nitride having a tensile stress with an absolute value of at least about 1200 MPa can be deposited from process gas comprising silicon-containing gas and nitrogen-containing gas, maintained in an electric field having a strength of from about 25 V/mil to about 300 V/mil. The electric field is formed by applying a voltage at a power level of less than about 60 Watts across electrodes that are spaced apart by a separation distance that is at least about 600 mils. Alternatively, silicon nitride having a compressive stress with an absolute value of at least about 2000 MPa can be formed in an electric field having a strength of from about 400 V/mil to about 800 V/mil.

19 Claims, 5 Drawing Sheets

U.S. PATENT DOCUMENTS

| | | |
|---|---|---|
| 6,039,834 A | 3/2000 | Tanaka et al. |
| 6,060,400 A | 5/2000 | Oehrlein et al. |
| 6,125,859 A | 10/2000 | Kao et al. |
| 6,140,255 A | 10/2000 | Ngo et al. |
| 6,148,832 A | 11/2000 | Gilmer et al. |
| 6,162,709 A | 12/2000 | Raoux et al. |
| 6,170,428 B1 | 1/2001 | Redeker et al. |
| 6,182,602 B1 | 2/2001 | Redeker et al. |
| 6,217,951 B1 | 4/2001 | Mizuno et al. |
| 6,271,146 B1 | 8/2001 | Ross |
| 6,284,633 B1 | 9/2001 | Nagabushnam et al. |
| 6,358,670 B1 | 3/2002 | Wong et al. |
| 6,368,931 B1 | 4/2002 | Kuhn et al. |
| 6,372,291 B1 | 4/2002 | Hua et al. |
| 6,372,672 B1 | 4/2002 | Kim et al. |
| 6,518,167 B1 | 2/2003 | You et al. |
| 6,548,899 B2 | 4/2003 | Ross |
| 6,566,278 B1 | 5/2003 | Harvey et al. |
| 6,582,777 B1 | 6/2003 | Ross et al. |
| 6,673,724 B2 | 1/2004 | Forster et al. |
| 2002/0053720 A1 | 5/2002 | Boursat et al. |
| 2003/0207033 A1 | 11/2003 | Yim et al. |
| 2003/0215570 A1 | 11/2003 | Seutter et al. |
| 2004/0083964 A1 | 5/2004 | Ingle et al. |
| 2004/0099915 A1 | 5/2004 | Takayama et al. |
| 2004/0101632 A1 | 5/2004 | Zhu et al. |
| 2004/0121085 A1 | 6/2004 | Wang et al. |
| 2004/0152338 A1 | 8/2004 | Gaillard et al. |
| 2004/0157453 A1 | 8/2004 | Delgadino et al. |
| 2004/0173570 A1 | 9/2004 | Ying et al. |

OTHER PUBLICATIONS

Cianci, et al., "Analysis of Stress and Composition of Silicon Nitride Thin Films Deposited by Electron Cyclotron Resonance Plasma-Enhanced Chemical Vapor Deposition for Microfabrication Processes", *Vacuum Sci. & Tech.*, 23:1, Jan. 6, 2005, pp. 168-172.

Tarraf, A., et al., "Stress Investigation of PECVD Dielectric Layers for Advanced Optical MEMS"., *J. of Micromech. & Microeng.*, 14:3, Mar. 1, 2004, pp. 317-323.

DEPOSITION OF TENSILE AND COMPRESSIVE STRESSED MATERIALS

BACKGROUND

In the processing of a substrate to fabricate circuits and displays, the substrate is typically exposed to an energized process gas capable of depositing or etching material on the substrate. In chemical vapor deposition (CVD) processes, process gas energized by high frequency voltage or microwave energy is used to deposit material on the substrate, which may be a layer, a filling of contact holes, or other selective deposition structures. The deposited layer can be etched or otherwise processed to form active and passive devices on the substrate, such as for example, metal-oxide-semiconductor field effect transistors (MOSFETs) and other devices. A MOSFET typically has a source region, a drain region, and a channel region between the source and drain. In the MOSFET device, a gate electrode is formed above and separated from the channel by a gate dielectric to control conduction between the source and drain.

The performance of such devices can be improved by, for example, reducing supply voltage, gate dielectric thickness, or channel length. However, such conventional methods face mounting problems as the size and spacing of the devices become ever smaller. For example, at very small channel lengths, the advantages of reducing channel length to increase the number of transistors per unit area and saturation current are offset by undesirable carrier velocity saturation effects. Similar benefits which are obtained from reducing gate dielectric thickness, such as decreased gate delay, are limited in small devices by increased gate leakage current and charge tunneling through the dielectric which can damage the transistor over time. Reducing supply voltage allows lower operating power levels but such reductions are also limited by the threshold voltage of the transistor.

In a relatively newly developed method of enhancing transistor performance, the atomic lattice of a deposited material is stressed to improve the electrical properties of the material itself, or of underlying or overlying material that is strained by the force applied by a stressed deposited material. Lattice strain can increase the carrier mobility of semiconductors, such as silicon, thereby increasing the saturation current of the doped silicon transistors to thereby improve their performance. For example, localized lattice strain can be induced in the channel region of the transistor by the deposition of component materials of the transistor, which have internal compressive or tensile stresses. For example, silicon nitrides used as etch stop materials and spacers for the suicide materials of a gate electrode can be deposited as stressed materials, which induce a strain in the channel region of a transistor. The type of stress desirable in the deposited material depends upon the nature of the material being stressed. For example, in CMOS device fabrication, negative-channel (NMOS) doped regions may be covered with a tensile stressed material having (positive sign convention) tensile stress; whereas positive channel MOS (PMOS) doped regions may be covered with a compressive stressed material having (negative sign convention) stress values.

Thus, it is desirable to form stressed materials that have predetermined types of stresses, such as tensile or compressive stresses. It is further desirable to control the level of stress generated in the deposited material. It is also desirable to deposit such stressed materials to generate uniform localized stresses or strains in the substrate. It is also desirable to have a process that can form stressed materials over active or passive devices on the substrate without damaging the devices.

SUMMARY

In one version, tensile-stressed silicon nitride having a tensile stress with an absolute value of at least about 1200 MPa is deposited on a substrate. The substrate is placed in a process zone and process gas comprising a silicon-containing gas and a nitrogen-containing gas is provided in the process zone. An electric field having a field strength of from about 25 V/mil to about 300 V/mil is maintained in the process zone. The electric field is formed by applying a voltage at a power level of less than about 60 Watts across electrodes that are spaced apart by a separation distance that is at least about 600 mils.

In another version, a silicon nitride having a compressive stress with an absolute value of at least about 2000 MPa can be deposited on a substrate, from the same process gas, by maintaining an electric field having a field strength of from about 400 V/mil to about 800 V/mil. The electric field is formed by applying a voltage at a power level of at least about 80 Watts across electrodes that are spaced apart by a separation distance that is less than about 400 mils.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
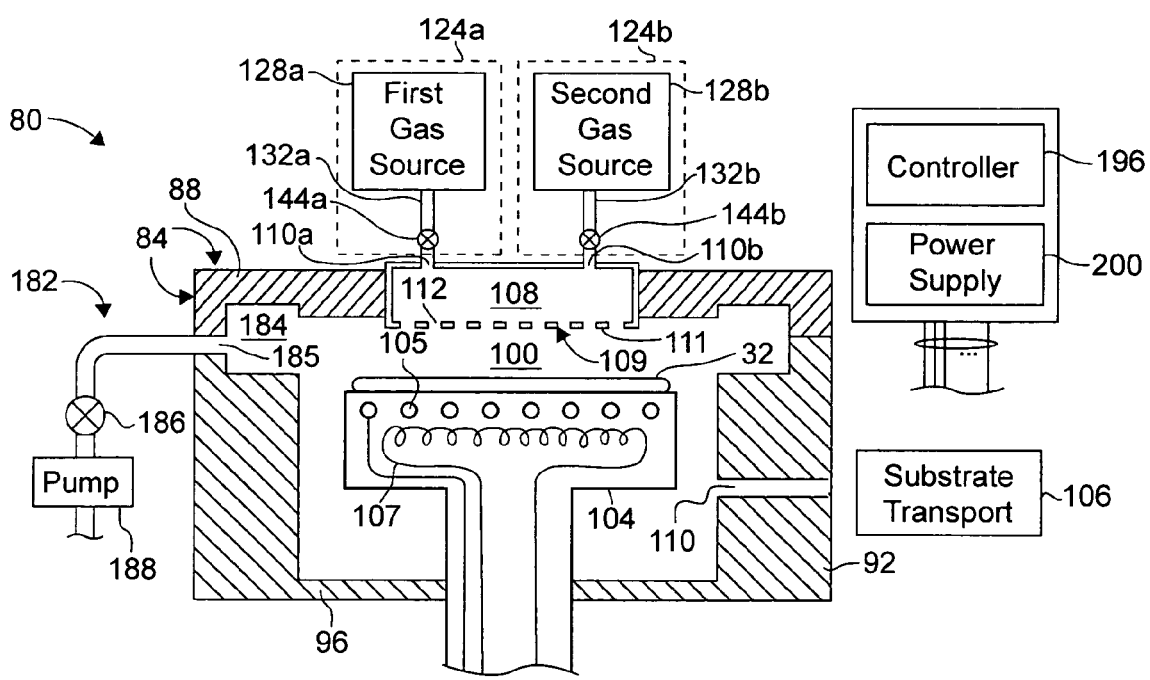
FIG. 1 is a schematic view of an exemplary embodiment of a substrate processing chamber that is a PE-CVD deposition chamber.

An embodiment of a substrate processing chamber 80 that can be used for depositing stressed materials according to the present invention is schematically illustrated in FIG. 1. While an exemplary chamber is used to illustrate the invention, other chambers as would be apparent to one of ordinary skill in the art may also be used. Accordingly, the scope of the invention should not be limited to the exemplary embodiment of the chamber or other components provided herein. Generally, the chamber 80 is a plasma enhanced chemical vapor deposition (PE-CVD) chamber suitable for processing a substrate 32, such as a silicon wafer. For example, a suitable chamber is a Producer® SE type chamber from Applied Materials, Santa Clara, Calif. The chamber 80 comprises enclosure walls 84, which include a ceiling 88, sidewalls 92, and a bottom wall 96, that enclose a process zone 100. The chamber 80 may also comprise a liner (not shown) that lines at least a portion of the enclosure walls 84 about the process zone 100. For processing a 300 mm silicon wafer, the chamber typically has a volume of about 20,000 to about 30,000 cm$^3$, and more typically about 24,000 cm$^3$.

During a process cycle, the substrate support 104 is lowered and a substrate 32 is passed through an inlet port 110 and placed on the support 104 by a substrate transport 106, such as a robot arm. The substrate support 104 can be moved between a lower position for loading and unloading, and an adjustable upper position for processing of the substrate 32. The substrate support 104 can include an enclosed electrode 105 to generate a plasma from process gas introduced into the chamber 80. The substrate support 104 can be heated by heater 107, which can be an electrically resistive heating element (as shown), a heating lamp (not shown), or the plasma itself. The substrate support 104 typically comprises a ceramic structure which has a receiving surface to receive the substrate 32, and which protects the electrode 105 and heater 107 from the chamber environment. In use, a radio frequency (RF) voltage is applied to the electrode 105 and a direct current (DC) voltage is applied to the heater 107. The electrode 105 in the substrate support 104 can also be used to electrostatically clamp the substrate 32 to the support 104. The substrate support 104 may also comprise one or more rings (not shown) that at least partially surround a periphery of the substrate 32 on the support 104.

After a substrate 32 is loaded onto the support 104, the support 104 is raised to a processing position that is closer to the gas distributor 108 to provide a desired spacing gap distance, $d_s$, there between. The gas distributor 108 is located above the process zone 100 for dispersing a process gas uniformly across the substrate 32. The gas distributor 108 can separately deliver two independent streams of first and second process gas to the process zone 100 without mixing the gas streams prior to their introduction into the process zone 100, or can premix the process gas before providing the premixed process gas to the process zone 100. The gas distributor 108 comprises a faceplate 111 having holes 112 that allow the passage of process gas therethrough. The faceplate 111 is typically made of metal to allow the application of a voltage or potential thereto, and thereby serve as electrode in the chamber 80. A suitable faceplate 111 can be made of aluminum with an anodized coating. The substrate processing chamber 80 also comprises first and second gas supplies 124a, b to deliver the first and second process gas to the gas distributor 108, the gas supplies 124a, b each comprising a gas source 128a, b, one or more gas conduits 132a, b, and one or more gas valves 144a, b. For example, in one version, the first gas supply 124a comprises a first gas conduit 132a and a first gas valve 144a to deliver a first process gas from the gas source 128a to a first inlet 110a of the gas distributor 108, and the second gas supply 124b comprises a second gas conduit 132b and a second gas valve 144b to deliver a second process gas from the second gas source 128b to a second inlet 110b of the gas distributor 108.

The process gas can be energized by coupling electromagnetic energy, for example, high frequency voltage energy to the process gas to form a plasma from the process gas. To energize the first process gas, a voltage is applied between (i) the electrode 105 in the support 104, and (ii) a second electrode 109 which may be the gas distributor 108, such as the faceplate 111, the ceiling 88 or chamber sidewall 92. The voltage applied across the pair of electrodes 105, 109 capacitatively couples energy to the process gas in the process zone 100. Typically, the voltage applied to the electrode 105, 109 is at a radio frequency. Generally, radio frequencies cover the range of from about 3 kHz to about 300 GHz. The selected radio frequency voltage is applied to the first electrode 105 at a power level of from about 10 W to about 1000 W, and the second electrode 109 is typically grounded.

The chamber 80 also comprises a gas exhaust 182 to remove spent process gas and byproducts from the chamber 80 and maintain a predetermined pressure of process gas in the process zone 100. In one version, the gas exhaust 182 includes a pumping channel 184 that receives spent process gas from the process zone 100, an exhaust port 185, a throttle valve 186 and one or more exhaust pumps 188 to control the pressure of process gas in the chamber 80. The exhaust pumps 188 may include one or more of a turbo-molecular pump, cryogenic pump, roughing pump, and combination-function pumps that have more than one function. The chamber 80 may also comprise an inlet port or tube (not shown) through the bottom wall 96 of the chamber 80 to deliver a purging gas into the chamber 80. The purging gas typically flows upward from the inlet port past the substrate support 104 and to an annular pumping channel. The purging gas is used to protect surfaces of the substrate support 104 and other chamber components from undesired deposition during the processing. The purging gas may also be used to affect the flow of process gas in a desirable manner.

A controller 196 is also provided to control the activities and operating parameters of the chamber 80. The controller 196 may comprise, for example, a processor and memory. The processor executes chamber control software, such as a computer program stored in the memory. The memory may be a hard disk drive, read-only memory, flash memory or other types of memory. The controller 196 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, support position, and other parameters of a particular process.

The chamber 80 also comprises a power supply 200 to deliver power to various chamber components such as, for example, the first electrode 105 in the substrate support 104 and the second electrode 109 in the chamber. To deliver power to the chamber electrodes 105, 109, the power supply 200 comprises a radio frequency voltage source that provides a voltage having the selected radio frequencies and the desired selectable power levels. The power supply 200 can include a single radio frequency voltage source, or multiple voltage sources that provide both high and low radio frequencies. The power supply 200 and also include an RF matching circuit. The power supply 200 can further comprise an electrostatic charging source to provide an electrostatic charge to an electrode often-electrostatic chuck in the substrate support 104. When a heater 107 is used within the substrate support 104, the power supply 200 also includes a heater power source that provides an appropriate controllable voltage to the heater 107. When a DC bias is to be applied to the gas distributor 108 or the substrate support 104, the power supply 200 also includes a DC bias voltage source that is connected to a conducting metal portion of the faceplate 111 of the gas distributor 108. The power supply 200 can also include the source of power for other chamber components, for example, motors and robots of the chamber.

The substrate processing chamber 80 also comprises a temperature sensor (not shown) such as a thermocouple or an interferometer to detect the temperature of surfaces, such as component surfaces or substrate surfaces, within the chamber 80. The temperature sensor is capable of relaying its data to the chamber controller 196 which can then use the temperature data to control the temperature of the processing chamber 80, for example, by controlling the resistive heating element in the substrate support 104.

Different types of stressed materials can be deposited in the exemplary chamber 80. One type of stressed material that is commonly deposited comprises stressed silicon nitride 20 (see FIG. 6) such as stressed silicon nitride. By silicon nitride it is meant a material having silicon-nitrogen (Si—N) bonds, including materials such as silicon oxynitride, silicon-oxygen-hydrogen-nitrogen, and other stoichiometric or non-stoichiometric combinations of silicon, nitrogen, oxygen, hydrogen and even carbon. Exemplary methods to deposit silicon nitride 20 will be described to illustrate the invention; however, it should be understood that these methods can also be used to deposit other types of materials, including stressed silicon oxide, stressed dielectric layers, and others. Thus, the scope of the present invention should not be limited to the illustrative stressed silicon nitride embodiment described herein.

In one version of a method to deposit stressed silicon nitride 20, the process gas introduced into the chamber comprises a first component that includes a silicon-containing gas and a second component that includes a nitrogen-containing gas. The silicon-containing gas can be, for example, silane, disilane, trimethylsilyl (TMS), tris(dimethylamino)silane (TDMAS), bis(tertiary-butylamino)silane (BTBAS), dichlorosilane (DCS), and combinations thereof. For example, a suitable silane flow rate is from about 5 to about 100 sccm. The nitrogen-containing gas can be, for example, ammonia, nitrogen, and combinations thereof. A suitable ammonia flow rate is from about 10 to about 200 sccm. The process gas can also include a diluent gas that is provided in a much larger volume that the reactive gas components. The diluent gas can also serve both as a diluent and at least partially as a reactant nitrogen-containing gas, for example, nitrogen in a flow rate of from about 5000 to about 30,000 sccm. The process gas may also contain additional gases such as an oxygen-containing gas, for example, oxygen, when depositing silicon oxy-nitride materials.

It has been discovered that the type of stressed material, namely tensile or compressively stressed materials, and the stress value of the deposited silicon nitride 20, can be set by controlling processing parameters, as described below. The processing parameters are described separately or in particular combinations; however, the invention should not be limited to the exemplary separate or combinations described herein, but may include other separate or combinations of parameters as would be apparent to one of ordinary skill in the art.

Without being limited by an explanation, it has been discovered that the stress values of stressed silicon nitride 20 can be selected by controlling process parameters that affect the electric field strength in the process zone of the chamber. An electric field having a preselected field strength can provide the desired type and magnitude of stress in the deposited material. The electric field strength in the chamber can be measured by an RF diagnostic tool such as a Z-Scan, which is commercially available from Applied Materials (and similar equipment from most RF Generator Manufacturers). Such an RF diagnostic tool is capable of measuring and determining the actual electric field strength in the chamber, which may be dependent upon factors such as the impedance of the plasma, and thus provides a more accurate measure of the electric field strength than estimates based on, for example, the power level applied to energize the gas. Such an RF diagnostic tool can also be used to measure other gas energizing properties, such as the ionization potential of the plasma and the power density. Thus, the gas energizing parameters can be selected to provide a predetermined electric field strength in the chamber according to the desired stress value of a deposited material.

The electric field strength is correlated with the plasma ionization potential and the amount of ion-bombardment of the substrate 32, with higher electric field strengths typically having a higher plasma ionization potential and greater ion-bombardment. It is believed that the extent of ion bombardment of the substrate 32 during deposition of the stressed material 20 effects the resulting stress value of the material. Higher levels of ion bombardment result in stressed silicon nitrides having compressive stress values, and lower levels of ion bombardment result in stressed silicon nitrides having tensile stress values. Thus, the stress value of a deposited film can be controlled by setting the electric field strength in the chamber to the desired level, for example, by setting a gas energizing parameter such as a power level or spacing between electrodes. Depositing material under a higher applied electric field strength, by for example, setting high gas energizer levels deposits stressed silicon nitride 20 with higher compressive stress values. As another example, the gas energizing parameters can also be selected to provide a lower electric field strength to deposit stressed silicon nitride 20 having tensile stress values.

A predetermined electric field strength can be provided in the chamber by setting a gas energizing parameter that includes, for example, the gas energizing power level, the gas energizing frequency, and/or the separation distance $d_s$ between the first and second gas energizing electrodes 105, 109, as well as other parameters that affect the electrical properties of the energized gas plasma. The gas energizing parameters affect properties of the plasma formed by energizing the deposition gas, including the electric field strength and ionization potential of the plasma.

Thus, silicon nitride 20 that is tensile-stressed is deposited on a substrate by selecting gas-energizing parameters to provide a relatively low electric field strength. Suitable electric field strength is less than about 400 V/mil. For example, the field strength can be from about 25 V/mil to about 300 V/mil, and more preferably from about 75 V/mil to about 100 V/mil. While a lower electric field is desirable, an electric field that is too low was found to result in plasma instability. The low electric field strength is suitable for depositing tensile-stressed silicon nitride 20 having a tensile stress value of at least about 1200 MPa and even at least about 1400 MPa. It should be noted that tensile stress is generally denoted as a positive value, so the absolute values and real values are the same, both being positive numbers.

The gas energizing power levels that are applied to energize the deposition gas to produce tensile-stressed silicon nitride 20 are selected in accordance with the desired predetermined electric field strength. For example, in the formation of tensile-stressed silicon nitride 20, a voltage may be applied to the first and second electrodes 105, 109 at a power level that is less than about 60 Watts, and more preferably less than about 30 Watts.

The frequency of RF energy applied also affects the electric field strength and ionization potential of the plasma. In general, relatively high frequencies tend to generate lower plasma potentials than relatively low frequencies. Thus, relatively high frequencies can be provided to generate a lower electric field strength that promotes the formation of more highly tensile-stressed silicon nitrides. A relatively high frequency suitable for depositing tensile-stressed silicon nitride 20 comprises a radio frequency (RF) of at least about 3 MHz, such as from about 3 MHz to about 60 MHz, and even from about 13 MHz to about 14 MHz, such as about 13.56 MHz. The relatively high radio frequency can also be provided at a relatively low power level to further control for the desired electric field strength. In one version, both high frequency voltage and low frequency voltage is applied to the electrodes 105, 109 to deposit tensile-stressed silicon nitride 20 on the substrate. In one example, high frequency power is applied at less than about 60 Watts, while low frequency power is applied at 40 Watts. In another example, high frequency power is applied at less than about 30 Watts without application of any low frequency power.

Conversely, a compressively-stressed silicon nitride 20 can be formed by selecting gas energizing parameters to provide a relatively high electric field strength of at least about 350 V/mil, such as from about 400 V/mil to about 800 V/mil, and more preferably from about 500 V/mil to about 700 V/mil. While a higher electric field is desirable, an electric field that is too high can damage underlying films on the substrate by excessive ion bombardment. The relatively high electric field strength may be suitable for depositing a compressively stressed silicon nitride 20 having a compressive stress value with an absolute value of at least about 2000 MPa, and even at least about 2800 MPa. Compressive stress is generally denoted as a negative value.

The gas energizing power levels that are applied to energize the deposition gas are selected in accordance with the desired high electric field strength. For example, in the formation of a compressively-stressed silicon nitride 20, a voltage may be applied to the first and second electrodes 105, 109 at a power level that may be at least about 80 Watts, and more preferably at least about 100 Watts. In one version, both high frequency voltage and low frequency voltage is applied to the electrodes 105, 109 to deposit compressive-stressed silicon nitride 20. In one example, high frequency power is applied at about 100 Watts, while simultaneously; low frequency power is applied at 40 Watts. In another example, high frequency power is applied at about 120 Watts without application of any low frequency power.

Relatively low gas energizing frequencies can be provided to promote the formation of compressively stressed silicon nitride films, as relatively low RF frequencies tend to generate higher electric field strengths and plasma potentials. A relatively low frequency suitable for depositing a compressively-stressed silicon nitride may comprise a frequency of less than about 1 MHz, such as from about 100 KHz to about 1 MHz, and even from about 300 KHz to about 400 KHz, such as about 350 KHz. The relatively low frequency can also be provided at a relatively high power level to further promote the effects of a higher electric field strength.

Figure 2A:
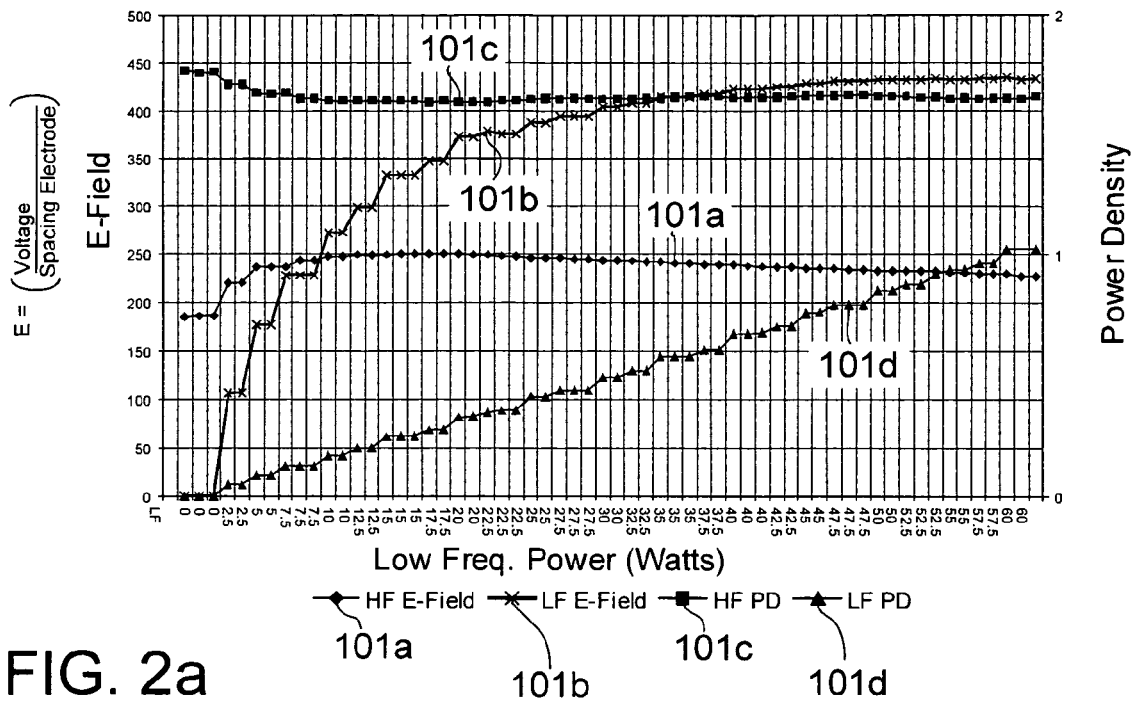
FIG. 2a is a graph showing the effect of increasing power levels of low frequency RF energy on the electric field strength and power density in a process chamber.
Figure 2B:
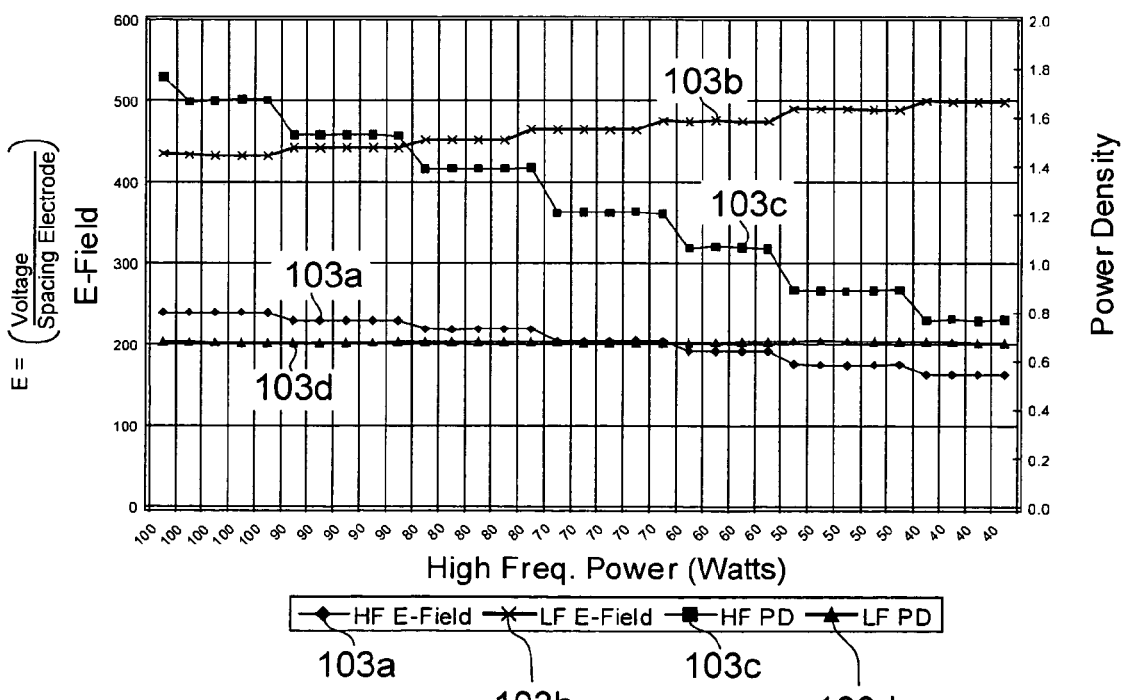
FIG. 2b is a graph showing the effect of decreasing power levels of high frequency RF energy on the electric field strength and power density in a process chamber.

The effect of the gas energizing frequency on the measured electric field strength is further demonstrated in FIGS. 2a and 2b. In FIG. 2a, the effect of the addition of low frequency power on the measured electric field strength and power density is demonstrated. In this figure, low frequency power was provided at increasing power levels and at a frequency of about 350 KHz, and the resulting electric field strength and power density of the resulting plasma was measured. Line 101b shows that the electric field strength increases relatively steeply for increasing amounts of low frequency power, for example from an electric field strength value of about 100 V/mil at about 2.6 Watts of the low frequency power, to an electric field strength value of about 400 V/mil at a power level of about 30 Watts, and even up to about 425 V/mil at a low frequency RF power level of about 50 Watts. The power density of the plasma, as shown by line 101d, can also be seen to increase almost linearly with increasing power levels of the low frequency RF energy, up to a power density of about 1 W/in$^3$ at a power level of about 60 Watts. Thus, FIG. 2a demonstrates that increasing the power level of the low frequency RF power supplied to energized gas results in an increased electric field strength and power density.

FIG. 2a further shows the effect of the combination of the low frequency RF power level with a high frequency RF power level on the electric field strength and power density, in lines 101a and 101c. For this measurement, the high frequency RF energy was coupled at a frequency of about 13.56 MHz and a power level of about 100 Watts. Low frequency RF power was combined at a frequency of about 350 KHz, for example, by providing a separate low frequency RF power source, and the resulting electric field strength and power density were measured for increasing power levels of the low frequency RF power. Line 101a shows the measured electric field strength for increasing low frequency power levels. Comparing line 101a for the combined low and high RF frequency powers with line 101b for just low frequency RF power, the combination of high and low RF frequencies decreases the measured electric field strength over the low frequency RF power alone, especially for low frequency power levels above about 7.6 Watts. The decrease in the measured electric field strength is evident, even though the power density of the plasma with combined low and high frequency power levels, as shown by line 101c, is increased over the low frequency RF power alone shown by line 101d. Thus, the addition of low frequency RF power is capable of actually reducing the electric field strength when combined with high frequency power.

In FIG. 2b, the effect of the addition of high frequency power on the measured electric field strength and power density is shown. In this figure, high frequency power was provided at a frequency of about 13.56 MHz, and the electric field strengths and power density of the resulting plasma was measured for decreasing values of the high frequency power level. Line 103a shows that the electric field strength decreases slightly for decreasing amounts of high frequency power, from an electric field strength of a little under 250 V/mil at a high frequency power level of about 100 Watts, to an electric field strength of a little under about 200 V/mil at a high frequency power level of about 40 Watts. Furthermore, by comparing the electric field strength generated at high frequencies, as illustrated by line 103a, to the electric field strength generated at low frequencies, shown by line 101b in FIG. 2a, it can be seen that the electric field strength generated at high frequencies is generally lower than the electric field strength generated by low frequencies at the same power levels. The power density of the high frequency plasma, shown by line 103c, can also be seen to decrease with decreasing high frequency power level.

FIG. 2b further shows the effect of the combination of the high frequency RF power level with a low frequency RF power level on the electric field strength and power density. For this measurement, the low frequency RF energy was coupled at a frequency of about 350 KHz and a power level of about 40 Watts. High frequency RF power was combined at a frequency of about 13.56 MHz, for example, by providing a separate high frequency RF power source, and the resulting electric field strength and power density was measured for decreasing power levels of the high frequency RF power. Line 103b shows the measured electric field strength for decreasing low frequency power levels. As can be seen by comparing line 103b for the combined high and low RF frequency powers with line 103a for just the high frequency RF powers, the combination of high and low RF frequencies actually increases the measured electric field strength with decreasing high frequency RF power over the high frequency RF power alone. The increase in the measured electric field strength is evident, even though the power density of the plasma with combined low and high frequency power levels, as shown by line 103d, is decreased over the plasma density generated by the low frequency RF power alone. Thus, the addition of low frequency RF power is capable of actually increasing the electric field strength when combined with high frequency power. Accordingly, the frequency of the gas energizing power applied to form the energized deposition gas can be selected to provide a desired electric field strength to promote the formation of a desired type and magnitude of stress in deposited stressed materials.

Yet another gas energizing parameter that can be selected to provide the desired magnitude and type of the stress value of the stressed silicon-nitride deposited material 20 is the spacing $d_s$ between the first and second gas energizing electrodes 105, 109, such as for example the spacing between an electrode 105 in the support 104 and the gas distributor faceplate 111. In general, the electric field strength can be observed to increase with closer spacing between the electrodes 105, 109, and decreases with wider spacing between the electrodes 105, 109. Thus, stressed silicon nitrides 20 having high tensile stress values typically occur for wider spacings $d_s$ between the electrodes 105, 109, whereas stressed silicon nitrides 20 having more compressive stress values typically occur for narrower spacings $d_s$ between the electrodes 105, 109. For example, a spacing $d_s$ between electrodes 105, 109 of at least about 600 mils, such as from about 700 mils to about 1000 mils, may be suitable for depositing tensile-stressed silicon nitride 20 having an absolute tensile stress value of at least about 1200 MPa. To deposit a compressively stressed silicon nitride 20 having an absolute compressive stress value of at least about 2000 MPa, a suitable spacing $d_s$ between electrodes 105, 109 may be less than about 400 mils, or even less than about 200 mils. Suitable spacing $d_s$ between electrodes 105, 109 to deposit compressively stressed silicon nitride 20 can be from about 100 mils to about 325 Mils.

Figure 3:
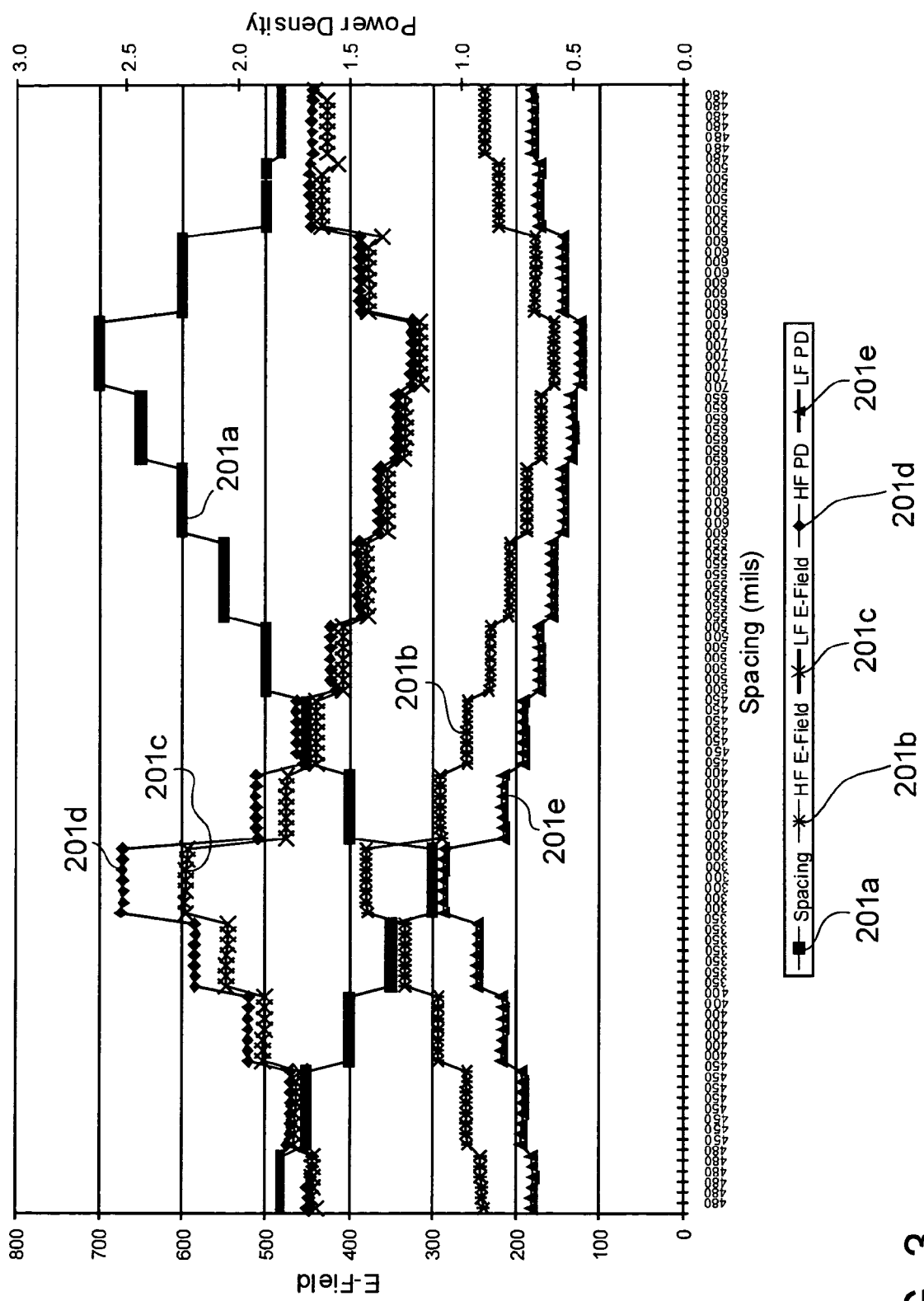
FIG. 3 is a graph showing the effect of varying the spacing between electrodes on the electric field strength and power density.

FIG. 3 demonstrates the effect of varying the spacing between the electrodes 105, 109 on the electric field and power density of the plasma. Line 201a represents the spacing between the electrodes 105, 109, which was varied from 480 mils down to 300 mils, back up to about 700 mils and then down again to 480 mils. Line 201b demonstrates the effect on a high frequency generated electric field of the varying line spacing. Line 201b shows that the electric field increases with decreasing spacing $d_s$, for example, the electric field increases from a value of about 250 V/mil at a spacing of 480 mils, to a value of a little under 400 V/mil at a spacing of 300 mils. Line 201c shows similar results for the effect on a low frequency generated electric field, as the electric field can be seen to increase with decreasing spacing $d_s$ between the electrodes 105, 109, and decrease with increasing electrode spacing. For example, the low frequency electric field increased from about 450 V/mil at a spacing $d_s$ of 480 mils, to an electric field strength value of about 600 V/mil at a spacing $d_s$ of 300 mils. The high frequency generated plasma density, shown by line 201d, and the low frequency generated plasma density, shown by line 201e, shown similar trends of inverse proportionality to variations in the electrode spacing. Thus, a closer spacing between the electrodes 105, 109 can be selected to provide a higher electric field strength in the chamber, thus promoting the formation of more compressively-stressed silicon nitrides. Conversely, a larger spacing between the electrodes 105, 109 can be selected to provide a lower electric field strength and to promote the formation of more tensile-stressed silicon nitrides.

Figure 4:
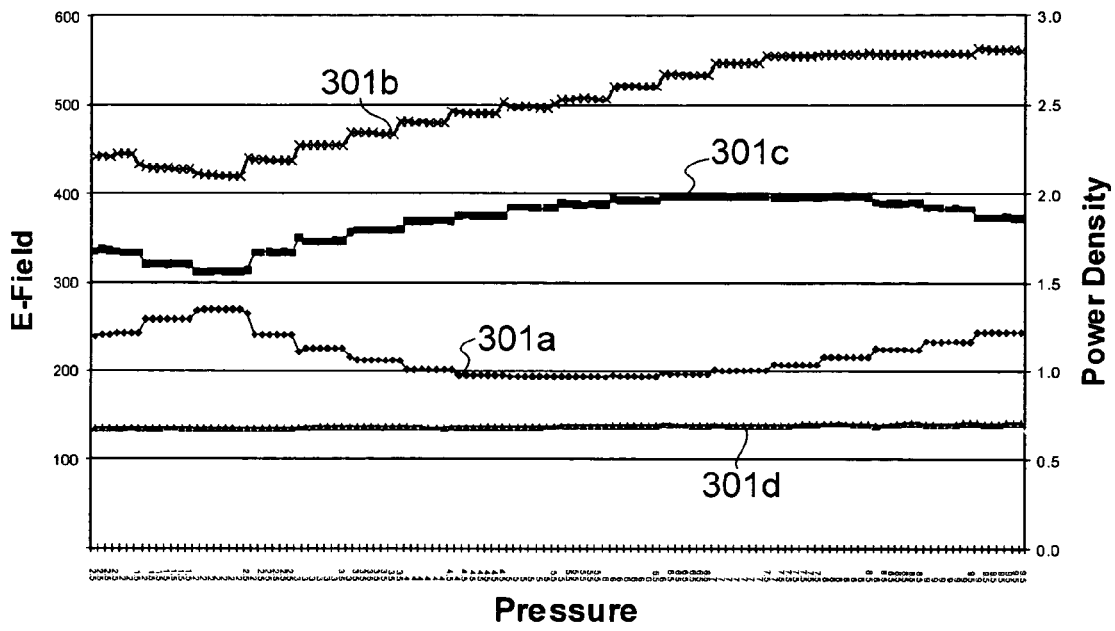
FIG. 4 is a graph showing the effect of increasing pressure levels on the electric field strength and power density.

In yet another version, process parameters such as the pressure and deposition gas flow rate have been discovered to effect the electric field strength and the resulting magnitude and nature of the stress of the deposited silicon nitrides. These process parameters may also depend on the gas energizing frequency being used to generate the energized gas plasma. An illustration of the effect of the pressure on the electric field strength and power density for both high and low gas energizing frequencies is shown in FIG. 4. In this figure, the high frequency was applied at a frequency of about 13.56 MHz and a power level of about 100 Watts, and the low frequency power was applied at a frequency of about 350 KHz and a power level of about 40 Watts. For example, line 301a shows the trend for the electric field strength of a plasma generated by the high frequency gas energizing power. Line 301a shows that the electric field strength for the high frequency field tends to decrease for increasing pressures above a pressure of about 2 Torr down to an electric field strength value of about 200 V/mil at a pressure of about 6 Torr. The electric field strength slowly increases with increasing pressure after about 6 Torr, remaining below 250 V/mil until about 9 Torr. Thus, for the deposition of highly tensile layers with high frequency gas energizing power levels, FIG. 4 shows that a desirable pressure level that promotes the formation of lower electric field strengths is a pressure of at least about 2 Torr, such as from about 2 Torr to about 9 10 Torr.

Line 301b shows the trend for the electric field strength with increasing pressures. Line 301b shows that that the electric field strength for low frequency electric fields tends to increase with increasing pressures from an electric field strength value of a little under about 450 V/mil at a pressure of about 2 Torr, to an electric field strength value of about 550 V/mil at a pressure of about 7.5 Torr. Thus, for the deposition of highly compressive layers utilizing low gas energizing frequencies, a suitable pressure may be at least about 2 Torr, such as from about 2 Torr to about 1 Torr, and even at least about 2 Torr, such as from about 2 Torr to about 1 Torr. The power density of the plasma generated by high frequency gas energizing power, as represented by line 301c can be seen to increase with increasing pressure, while the power density generated by low frequency gas energizing power, as represented by line 301d can be seen to remain substantially stable for increasing pressures. Thus, the pressure in the process chamber can be selected in conjunction with gas energizing parameters to provide a desired electric field strength and stress value of the deposited silicon nitride.

Figure 5:
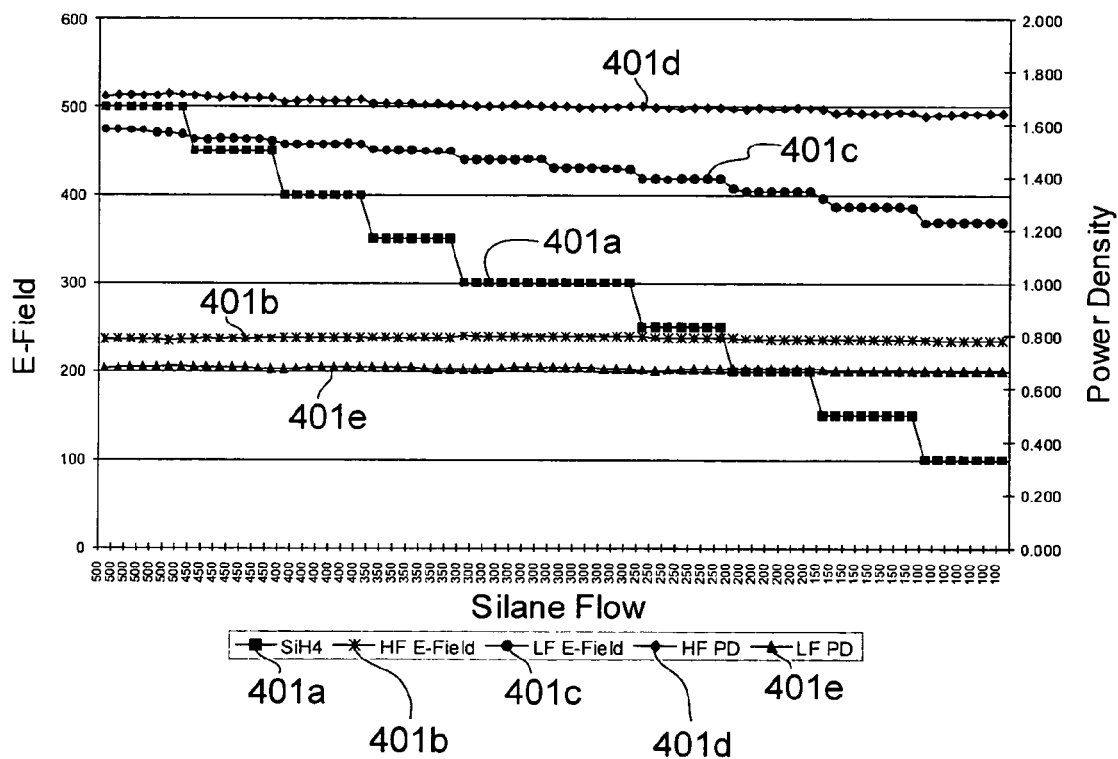
FIG. 5 is a graph showing the effect of decreasing silane gas flow rates on the electric field strength and power density.

FIG. 5 provides an illustration of the effect of the silane flow rate on the electric field strength and power density of a plasma in the process chamber. Line 401a shows the silane flow rate, which was decreased from 500 sccm to 100 sccm. Line 401b shows the electric field strength for a high frequency electric field with decreasing silane flow rate. In this case the power levels dominate the reaction and the HF field strength does not move with lower silane flow. Other data, based on the final process conditions indicate that E-field is lower. The conditions need to be less than 100 W HF and Silane flows around 30 sccm. Line 401c shows that the high frequency electric field strength decreases with decreasing flow rate of the silane gas, from an electric field strength of about 475 V/mil at a silane flow rate of about 500 sccm, to an electric field strength of about 375 V/mil at a silane flow rate of about 100 sccm. Thus, decreasing the silane flow rate may be beneficial in promoting lower electric field strengths for high frequency electric fields, and thus for forming more tensile-stressed silicon nitrides. A suitable silane flow rate for forming tensile-stressed silicon nitride film may be, for example a flow rate of less than about 100 sccm, such as from about 100 to about 25 sccm. Line 401d shows the effect of the silane flow rate on the electric field strength of a low frequency electric field. The electric field strength of the low frequency electric field decreases slightly with decreasing silane flow rates, while remaining around about 500 V/mil. Accordingly, a suitable silane flow rate for forming a compressively stressed silicon nitride film may be from about 70 sccm to about 120 sccm, such as about 50 sccm to about 240 sccm. The power density generated by the high frequency and low frequency powers, as illustrated by lines 401b and 401e, respectively, of FIG. 5, can be seen to remain substantially the same for decreasing silane flow rates, with the high frequency power density being about 0.800 W/Mil and the low frequency power density being about 0.700 W/mil. Accordingly, the flow rate of silane gas can be selected to provide a desired electric field strength and the desired stress value of a deposited silicon nitride.

An example of a suitable process for depositing tensile-stressed silicon nitride 20 will now be described. In this example, a deposition gas comprising from about 20 to about 50 sccm of silane, such as about 25 sccm of silane, from about 3200 to about 1600 sccm of $NH_3$, and from about 5000 to about 30000 sccm of $N_2$, such as about 25000 sccm of $N_2$, is introduced into the process zone 100 of the chamber 80. The pressure in the process zone is maintained at from about 2 Torr to about 10 Torr, such as about 6 Torr. A gas energizing power level is applied to energize the gas by applying a voltage to the first and second electrodes 105, 109 at a power level of from about 100 Watts to about 20 Watts, such as about 30 Watts, at a relatively high gas energizing radio frequency of from about 13 MHz to about 14 MHz, such as about 13.56 MHz. A spacing $d_s$ between the electrodes is selected to be from about 400 Mils to about 1000 Mils, such as about 600 Mils. The process parameters are maintained to provide electric field strength of from about 300 V/mil to about 100 V/mil, such as about 150V/mil. The process is capable of depositing tensile-stressed silicon nitride having a stress value of from about 500 MPa to about 1.4 GPa, such as about 1.2 GPa.

In an example of a suitable process for depositing a compressively-stressed silicon nitride, a deposition gas comprising from about 50 sccm to about 240 sccm of silane, such as about 120 sccm of silane, from about 1600 sccm to about 3200 sccm of $NH_3$, and from about 1000 sccm to about 10000 sccm of $N_2$, such as about 5000 sccm of $N_2$, is introduced into the process zone 100 of the chamber 80. The pressure in the process zone 100 is maintained at from about 6 Torr to about 1 Torr, such as about 1.5 Torr. A gas energizing power level is applied to energize the gas by applying a voltage to the first and second electrodes 105, 109 at a power level of from about 30 Watts to about 500 Watts, such as about 100 Watts at a relatively low gas energizing radio frequency of from about 300 KHz to about 400 KHz, such as about 350 KHz. A spacing ds between the electrodes is selected to be from about 400 Mils to about 100 Mils, such as about 325 Mils. The process parameters are maintained to provide electric field strength of from about 300 V/mil to about 600 V/mil, such as about 500 V/mil. The process is capable of depositing a compressively stressed silicon nitride 20 having an absolute value of the compressive stress value that is at least about 2000 MPa.

In one version, the electric field strength in the chamber 80 may even be monitored during or between substrate processes to determine whether the electric field strength is within the predetermined range, and a feedback control loop may be provided to control process parameters in relation to the measured electric field. For example, the controller 196 may comprise computer program code comprising electric field detection code adapted to measure the electric field strength or other electrical and plasma properties in the chamber, such as with the RF diagnostic tool described above, and to determine whether the measured electric field strength is within a desired electric field strength range that is suitable for the desired type and magnitude of the stressed material being deposited. For example, the electric field detection code may comprise program code to compare the measured electric field strength against look-up tables showing the predetermined electric field strengths suitable for the deposition of materials having the desired deposited stress values. The controller 196 may further comprise process control code to vary one or more process parameters in relation to the detected electric field or other electrical property. For example, the controller may comprise process control code to change one or more parameters that effects the electric field strength, such as for example at least one of the gas energizing power level, frequency, electrode spacing, pressure, and gas flow rates, to bring the measured electric field strength within the predetermined range. Thus, the feedback control system may allow for in-situ selection of a predetermined electric field strength and the desired deposited material stress values.

Figure 6:
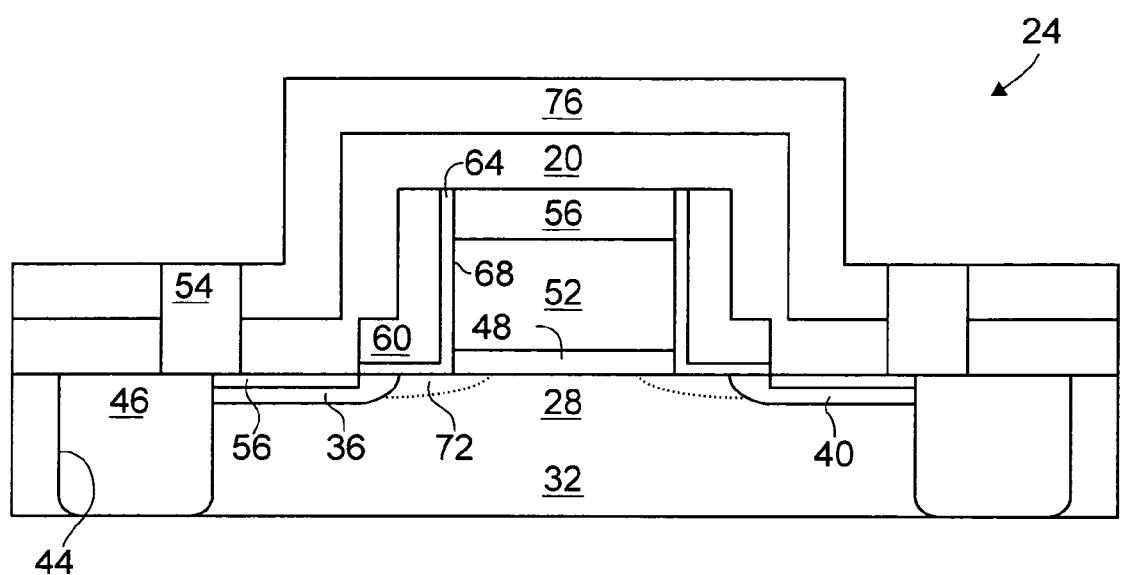
FIG. 6 is a simplified cross-sectional view of an embodiment of a substrate showing a partial view of a transistor structure with an overlying deposited stressed silicon nitride.

In one exemplary application, the tensile or compressive stressed silicon nitride is formed on a substrate 32 in the fabrication of a MOSFET structure 392—which is illustrated in the simplified cross-sectional diagram of FIG. 6. The relatively high internal stress of the deposited and treated silicon nitride 20, which is a stressed silicon nitride in FIG. 6, induces a strain in a channel region 28 of the transistor 24. The induced strain improves carrier mobility in the channel region 28, which improves transistor performance, such as for example, by increasing the saturation current of the transistor 24. The silicon nitride 20 can also have other uses within the MOSFET 24, for example, as an etch stop material. The highly stressed silicon nitride 20 is also useful in other structures, such as other transistors including without limitation, bipolar junction transistors, capacitors, sensors, and actuators. The substrate can be a silicon wafer or can be made from other materials such as germanium, silicon germanium, gallium arsenide and combinations thereof. The substrate 32 can also be a dielectric, such as glass, which is used in the fabrication of displays.

The transistor 24 illustrated in FIG. 6 is a negative channel, or n-channel, MOSFET (NMOS) having source and drain regions 36, 40 that are formed by doping the substrate 32 with a Group VA element to form an n-type semiconductor. In the NMOS transistor, the substrate 32 outside of the source and drain regions 36, 40 is typically doped with a Group IIIA element to form a p-type semiconductor. For the NMOS channel regions, the overlying stressed silicon nitride is fabricated to have a tensile stress.

In another version, the MOSFET transistor 24 comprises a positive channel or p-channel MOSFET (PMOS), (not shown) which has source and drain regions that are formed by doping the substrate with a Group IIIA element to form a p-type semiconductor. In a PMOS transistor, the transistor 24 may comprise a substrate 32 comprising an n-type semiconductor or may have a well region (not shown) comprising an n-type semiconductor formed on a substrate 32 comprising a p-type semiconductor. The PMOS channel regions are covered with a compressive stressed silicon nitride.

In the version shown, the transistor 24 comprises a trench 44 to provide isolation between transistors 24 or groups of transistors 24 on the substrate 32, a technique known as shallow trench isolation. The trench 44 is typically formed prior to the source and drain regions 36, 40 by an etch process. A trench sidewall liner material (not shown) may be formed in the trench 44 by, for example, a rapid thermal oxidation in an oxide/oxinitride atmosphere, which may also round sharp corners on the trench 44 (and elsewhere). In one version, the trench 44 may be filled with material 46 having a tensile stress, which can also be used to provide a tensile stress to the channel region 28. The deposition of the trench material 46 which may include the use of a High Aspect Ratio Process (HARP), which may include using an O₃/tetraethoxy silane (TEOS) based sub-atmospheric chemical vapor deposition (SACVD) process. Excess trench material 46 may be removed by, for example, chemical mechanical polishing.

The transistor comprises a gate oxide material 48 and a gate electrode 52 on top of the channel region 28 between the source and drain regions 36, 40. In the version shown, the transistor 24 also comprises silicide materials 56 on top of the source and drain regions 36, 40 as well as the gate electrode 52. The silicide materials 56 are highly conductive compared to the underlying source and drain regions 36, 40 and gate electrode 52, and facilitate the transfer of electric signals to and from the transistor 24 through metal contacts 54. Depending on the materials and formation processes used, the silicide materials 56 may also comprise a tensile stress and produce tensile strain in the channel region 28. The transistor shown also comprises spacers 60 and oxide-pad materials 64 which may be located on opposite sidewalls 68 of the gate electrode 52 to keep the silicide materials 56 separated during a silicidation process to form the silicide materials 56. During silicidation, a continuous metal material (not shown) is deposited over the oxide-containing source and drain regions 36, 40 and gate electrode 52, as well as the nitride containing spacers 60. The metal reacts with the underlying silicon in the source and drain regions 36, 40 and gate electrode 52 to form metal-silicon alloy silicide materials, but are less reactive with the nitride materials in spacers 60. Thus, the spacers 60 allow the overlying, unreacted metal to be etched away while not affecting the metal alloy in suicide materials 56.

The length of the channel region 28 is shorter than the length of the gate oxide material 48. The length of the channel region 28 measured between the edges of the source region 36 and the drain region 40 may be about 90 nm or less, for example, from about 90 nm to about 10 nm. As the length of channel region 28 gets smaller, implants 72, also known as halos, may be counter-doped into the channel region 28 to prevent charge carriers from uncontrollably hopping from the source region 36 to the drain region 40 and vice versa.

In the version shown in FIG. 6, the silicon nitride 20 is formed above the silicide materials 56. The silicon nitride 20 typically acts as a contact-etch stop material as well as providing strain to the channel region 28. The silicon nitride 20 is capable of being deposited to have a stress values ranging from compressive to tensile stresses. The selection of the stress in the silicon nitride 20 selects the type of strain provided to the channel region 28 of the transistor 24.

Following the formation of the silicon nitride 20, a dielectric material 76, also referred to as a pre-metal dielectric material, may be deposited on the silicon nitride 20. The dielectric material 76 may be, for example, borophosphosilicate glass, phosphosilicate glass, borosilicate glass, and phosphosilicate glass, among other materials. The dielectric material 76 may be formed using HARP that includes O₃/TEOS in conjunction with SACVD. The dielectric material 76 may also comprise a tensile stress, which produces a tensile strain in the channel region 28.

Although exemplary embodiments of the present invention are shown and described, those of ordinary skill in the art may devise other embodiments which incorporate the present invention, and which are also within the scope of the present invention. For example, other process parameters besides those specifically mentioned may be selected to provide the predetermined electric field strength. Also, the stressed silicon nitride may be deposited on substrates and in configurations other than those specifically described. Furthermore, the terms below, above, bottom, top, up, down, first and second and other relative or positional terms are shown with respect to the exemplary embodiments in the FIGS., and are interchangeable. Therefore, the appended claims should not be limited to the descriptions of the preferred versions, materials, or spatial arrangements described herein to illustrate the invention.

What is claimed is:

1. A method of depositing tensile-stressed silicon nitride on a substrate, the method comprising:
    (a) placing the substrate in a process zone;
    (b) introducing a process gas into the process zone, the process gas comprising silicon-containing gas and nitrogen-containing gas; and
    (c) depositing on the substrate, tensile-stressed silicon nitride having a tensile stress with an absolute value of at least about 1200 MPa, by maintaining in the process zone, an electric field having a field strength of from about 25 V/mil to about 300 V/mil, wherein the electric field is formed by applying a voltage at a power level of less than about 60 Watts across electrodes that are spaced apart by a separation distance that is at least about 600 mils.

2. A method according to claim 1 comprising maintaining an electric field having a field strength of from about 75 V/mil to about 100 V/mil.

3. A method according to claim 1 comprising applying a voltage at a power level of less than about 30 Watts across electrodes.

4. A method according to claim 1 comprising separating the electrodes by a separation distance of from about 700 mils to about 1000 mils.

5. A method according to claim 1 comprising maintaining an electric field having a field strength that is sufficiently high to deposit silicon nitride having a tensile stress with an absolute value of at least about 1400 MPa.

6. A method according to claim 1 comprising applying a voltage having a frequency of from about 3 MHz to about 60 MHz.

7. A method according to claim 1 wherein the process gas comprises silane, $NH_3$ and $N_2$.

8. A method of depositing tensile-stressed silicon nitride on a substrate, the method comprising:
   (a) placing the substrate in a process zone;
   (b) introducing a process gas into the process zone, the process gas comprising silane, $NH_3$ and $N_2$; and
   (c) depositing on the substrate, tensile-stressed silicon nitride having a tensile stress with an absolute value of at least about 1400 MPa, by maintaining in the process zone, an electric field having a field strength of from about 75 V/mil to about 100 V/mil, wherein the electric field is formed by applying a voltage at a power level of less than about 30 Watts across electrodes that are spaced apart by a separation distance of from about 700 mils to about 1000 mils.

9. A method according to claim 8 comprising applying a voltage having a frequency of from about 13 MHz to about 14 MHz.

10. A method of depositing compressive-stressed silicon nitride on a substrate, the method comprising:
    (a) placing the substrate in a process zone;
    (b) introducing a process gas into the process zone, the process gas comprising silicon-containing gas and nitrogen-containing gas; and
    (c) depositing on the substrate, compressive-stressed silicon nitride having a compressive stress with an absolute value of at least about 2000 MPa, by maintaining in the process zone, an electric field having a field strength of from about 400 V/mil to about 800 V/mil, wherein the electric field is formed by applying a voltage at a power level of at least about 80 Watts across electrodes that are spaced apart by a separation distance that is less than about 400 mils.

11. A method according to claim 10 comprising maintaining an electric field having a field strength of from about 500 V/mil to about 700 V/mil.

12. A method according to claim 10 comprising applying a voltage at a power level of at least about 100 Watts across the electrodes.

13. A method according to claim 10 comprising separating the electrodes by a separation distance of less than about 200 mils.

14. A method according to claim 10 comprising separating the electrodes by a separation distance of from about 100 mils to about 325 mils.

15. A method according to claim 10 comprising maintaining an electric field having a field strength that is sufficiently high to deposit silicon nitride having a compressive stress with an absolute value of at least about 2800 MPa.

16. A method according to claim 10 comprising applying a voltage having a frequency of from about 100 kHz to about 1 MHz.

17. A method according to claim 10 wherein the process gas comprises silane, $NH_3$ and $N_2$.

18. A method of depositing compressive-stressed silicon nitride on a substrate, the method comprising:
    (a) placing the substrate in a process zone;
    (b) introducing a process gas into the process zone, the process gas comprising silane, $NH_3$ and $N_2$; and
    (c) depositing on the substrate, compressive-stressed silicon nitride having a compressive stress with an absolute value of at least about 2800 MPa, by maintaining in the process zone, an electric field having a field strength of from about 500 V/mil to about 700 V/mil, wherein the electric field is formed by applying a voltage at a power level of at least about 100 Watts across electrodes that are spaced apart by a separation distance of from about 100 mils to about 325 mils.

19. A method according to claim 18 comprising applying a voltage having a frequency of from about 300 kHz to about 400 kHz.

\* \* \* \* \*